United States Patent [19]

Alles

[11] 4,190,826
[45] Feb. 26, 1980

[54] MULTIDEVICE POSITION DIGITAL ENCODER

[75] Inventor: Harold G. Alles, Bridgewater, N.J.

[73] Assignee: Bell Telephone Laboratories, Incorporated, Murray Hill, N.J.

[21] Appl. No.: 798,161

[22] Filed: May 18, 1977

[51] Int. Cl.² .................... G06F 3/02; G10H 1/00
[52] U.S. Cl. .................... 340/365 S; 84/1.01; 84/1.17; 178/17 C
[58] Field of Search ............ 340/365 C, 365 R, 365 S, 340/200, 347 P; 84/DIG. 7, 1.01, 1.17; 179/90 K; 178/17 A, 17 C, 19; 324/95, 76 R; 318/662

[56] References Cited

U.S. PATENT DOCUMENTS

| | | | |
|---|---|---|---|
| T904,008 | 11/1972 | Crouse | 340/365 C |
| 2,765,459 | 10/1956 | Winter | 340/365 P |
| 2,788,516 | 4/1957 | Girerd | 340/200 |
| 3,361,966 | 1/1968 | Gerber et al. | 324/77 E |
| 3,585,297 | 6/1971 | Scuitto et al. | 178/17 C |
| 3,623,082 | 11/1971 | Stein et al. | 340/365 S |
| 3,845,377 | 10/1974 | Shimotori | 340/200 |
| 3,846,580 | 11/1974 | Brenner | 178/19 |
| 3,921,166 | 11/1975 | Volpe | 340/365 C |
| 3,949,365 | 4/1976 | Kashio | 340/365 S |
| 3,961,318 | 6/1976 | Farrand et al. | 340/200 |

Primary Examiner—John W. Caldwell, Sr.
Assistant Examiner—James J. Groody
Attorney, Agent, or Firm—Charles S. Phelan

[57] ABSTRACT

At least one movable device is mechanically coupled to a coupling device which moves in response to the motion of the movable device. The coupling device moves in a path which closely parallels the path of a time-varying, propagating electric field. Upon interception of the electric field with the coupling device, a signal is transferred through the coupling device by capacitive coupling with the field to an input of a detector. The signal is detected by circuitry which generates a pulse width modulated (PWM) signal corresponding to the period of time between the initiation of the propagation of the electric field and the moment of interception. Circuitry is provided to generate pulse code modulated (PCM) signals responsive to the position location of up to $2^n$ movable devices.

17 Claims, 5 Drawing Figures

MULTIDEVICE POSITION DIGITAL ENCODER

BACKGROUND OF THE INVENTION

1. Field of the Invention

This invention relates to digital encoding arrangements of the type which convert the position location of a movable device into a digital electric signal suitable for processing by digital computer. More particularly, this invention relates to the digital encoding of movable devices such as the keyboard keys and pedals of a musical organ or synthesizer.

2. Description of the Prior Art

A first method known in the prior art for generating digital data responsive to the position of a movable device, such as a key in the keyboard of a musical instrument, provides mechanical coupling between the key and a respectively associated two-state switch. Depression of the key causes the switch to change states, thereby affording detection of only two key positions—up and down. Circuitry may be provided to sequentially scan the switches to determine each one's binary state and transmit the information to a computer. This arrangement, however, suffers from the substantial shortcoming of invariable threshold. Transient and intermediate key positions cannot be encoded, and the arrangement is unsuitable for the generation of touch-responsive dynamic data.

The prior art provides schemes which generate signals responsive to the transient location of a movable member. A first such scheme relates to the mechanical coupling of a movable device to an optical fiber. One end of the fiber is affixed to a stationary support and the other end follows a predetermined path as the movable device is moved. A source of light is located near the stationary end of the fiber so as to permit the light to enter the fiber at the stationary end and exit at the moving end. Plural photoelectric cells are located near the path of the moving end of the optical fiber and receive the light emitted from the fiber as the movable device moves. The resolution of such an arrangement is limited by the number of photoelectric cells which can be situated near the path of the moving end of the fiber. Typically, ten or more photoelectric cells are required for each movable device. The cost and interconnection complexity of this arrangement when used in a system containing over 250 movable devices is obviously prohibitive.

Magnetostrictive delay lines have been used in the prior art to generate digital data responsive to the location of a movable device. Briefly, a movable device with an associated pickup coil travels along the length of the delay line. An electrical signal initiates a propagating strain wave along the delay line and starts a clocked counter. When the strain wave passes the point on the magnetostrictive delay line where the pickup coil is located, a signal induced in the coil stops the counter. The digital number contained in the counter at the time it is stopped is representative of the location of the pickup coil along the delay line. This magnetostrictive approach to the digital encoding of analog positions requires many such delay lines and associated hardware in a system for encoding many movable devices. Furthermore, since the rate of strain wave propagation along the delay line is a function of its geometry and age, precise correlation between the various delay lines is virtually impossible.

It is, therefore, an object of this invention to generate digital signals responsive to the instantaneous position location of each of a multiplicity of separate movable devices, irrespective of whether each device is at rest or in transition.

It is a further object of this invention to provide an economical system for generating digital signals responsive to the position location of each of a multiplicity of separate movable devices relative to a reference common to all such devices.

SUMMARY OF THE INVENTION

An arrangement is disclosed for generating digital signals responsive to the analog location position of a movable device. The movable device is in mechanical contact with a coupling device which moves in response to the motion of the movable device. The coupling device moves in a path which closely parallels the path of a time-varying change in an electric field. Circuitry is disclosed which generates digital signals responsive to a signal which is transferred to the coupling device by capacitive interaction with the time varying electric field. The digital signals correspond to the position of the coupling device relative to the path of the propagating change in the electric field.

In one embodiment of the invention, a digital encoding counter is started when the change in the electric field begins its propagation, which counter is read at the instant that the propagating change in the electric field and the coupling device intercept one another.

It is a feature of one embodiment of the invention that the signal in the encoding counter at the moment of such interception is representative of the location of the coupling device relative to the starting point of the propagating change in the electric field. The propagating change in the electric field is generated by altering the potential on each of plural parallel conductors in a flat ribbon cable, in accordance with a predetermined time sequence, from a first to a second voltage level. The coupling device is, in effect, a plate of a capacitor which is capacitively coupled via the atmosphere as a dielectric to the individual conductors in the flat ribbon cable. Thus, as the voltage on the conductor in the cable nearest the coupling device experiences the change in voltage level, a charge is transferred to the coupling device by capacitor action. Circuitry is provided to cause the potential on the conductors to change in sequence beginning with one of the outermost conductors and continuing to sequentially adjacent conductors until the other outermost conductor is at the second voltage level. When all of the conductors are at the second voltage level, all of the conductors are simultaneously reset to the first voltage level and the foregoing operation recycles. Each cycle of the operation causes what may be conceptualized as an electric field wavefront which extends along the length of the conductors and propagates across the flat ribbon cable in a direction perpendicular to the longitudinal axes of the conductors.

It is a feature of this invention that the propagating change in electric field surrounds the conductors throughout their length, which length may be tailored to the requirements of the specific embodiment. This feature permits many coupling devices to be situated therealong without the need to duplicate the field-generating hardware. In addition to the substantial reduction in hardware complexity and cost resulting from above, this invention additionally provides that all of the movable devices are referenced to a single standard, the electrically determined rate of propagation of the change in the electric field, thereby providing a degree of encoding resolution and correlation between the movable devices which was heretofore unattainable in prior art systems for encoding the location positions of many movable devices.

BRIEF DESCRIPTION OF THE DRAWING

Comprehension of the invention is facilitated by reading the following detailed description in conjunction with the accompanying drawing, in which.

DETAILED DESCRIPTION

Figure 1:
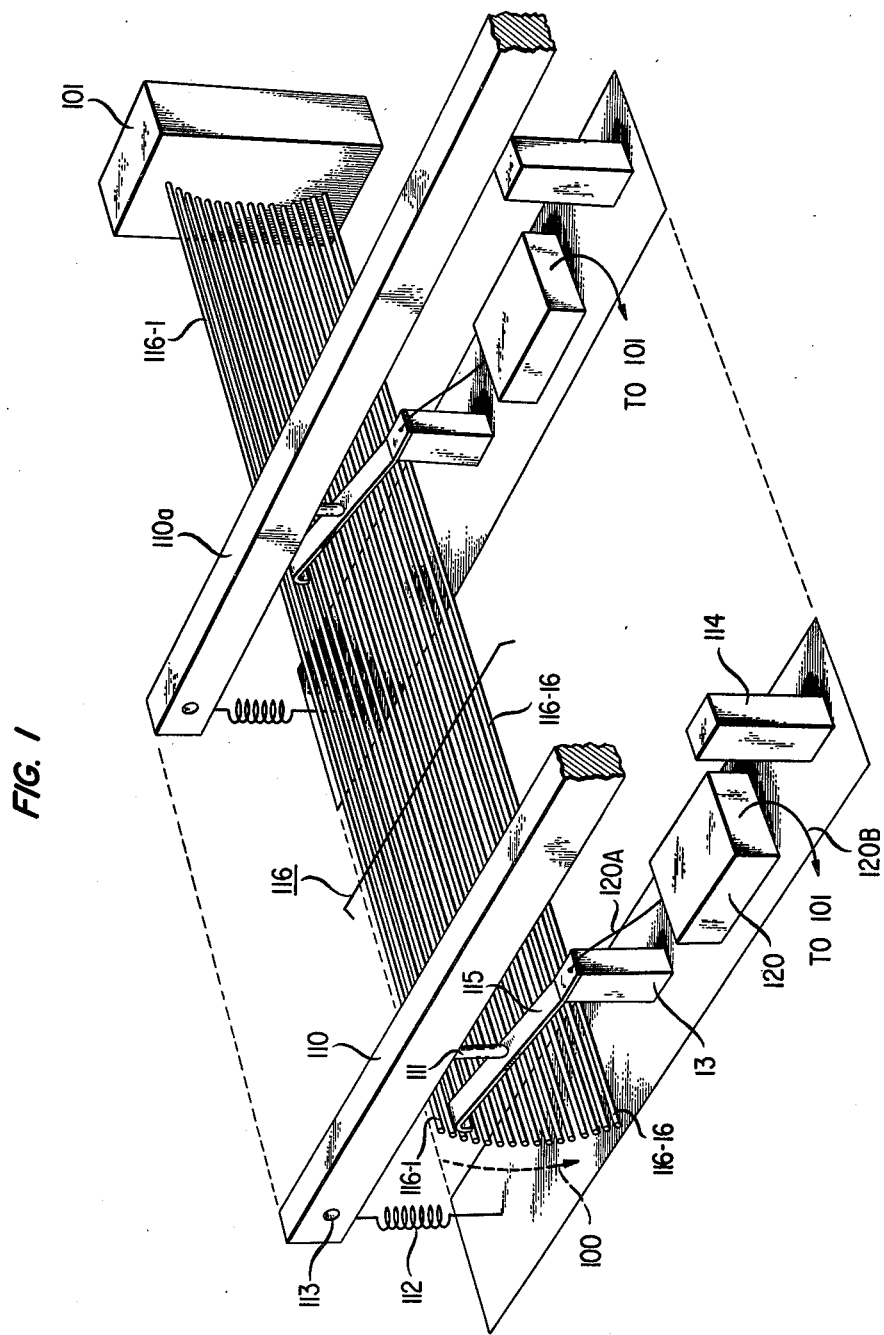
FIG. 1 shows the physical arrangement of an illustrative embodiment of the invention.

FIG. 1 depicts an illustrative arrangement of keyboard keys 110 and 110a which are correspondingly identical in relevant structure and are presented to illustrate that many such keys are advantageously situated along the length of conductors 116. Inasmuch as the keys are correspondingly identical, the following discussion will be referenced to only one such key, key 110. Also, when reference is made to the conductors collectively, they will be denominated "conductors 116." References to individual conductors will include the collective identification number 116 and an individual identification number as, for example, conductor 116-1. Elements of structure in the system which are shown in more than one figure bear the same identification symbol in each figure.

Keyboard key 110 is of the type obtainable in commercially available keyboards such as a 61-note keyboard model number 10-0-0027 manufactured by Pratt-Reed, Inc. Several such keyboards cooperate with each other and with a pedal keyboard and timbre stops in predesigned combination to comprise a system with over 250 movable devices. The key is pivotally secured at illustrative pivot 113 by a rod (not shown) common to all keys in the keyboard, or other equivalent pivot means, to permit vertical motion, and is held in a substantially horizontal rest position by spring 112. Switch pin 111 is secured to and depends from the key. The switch pin is in electrically insulated mechanical contact with coupling device 115 which moves vertically as the key is operated.

Coupling device 115 is made of springy sheet metal. In the illustrative embodiment, beryllium copper sheet metal approximately 0.010 inch thick is cut in the form of a rectangle approximately ¼ inch wide by 3 inches long. One end of the rectangle is bent almost 90 degrees at about 3/16 inch from the end so as to form an end face which covers several of the parallel conductors, and the other end is affixed to standoff 13 as shown in FIG. 1. As key 110 is depressed switch pin 111 deflects the free end of coupling device 115 downwardly. The moving end of the coupling device describes an arcuate path which closely parallels the surface formed by the parallel arrangement of conductors 116. In one embodiment, the spacing between the end face of the coupling device and the parallel conductors is approximately 1/16 of an inch. Switch pin 111 and coupling device 115 are so situated with respect to one another that the moving end of coupling device 115 travels substantially the entire distance between conductors 116-1 and 116-16 when the key is depressed sufficiently to contact key stop 114. The coupling device is connected to a detector amplifier 120 via conductor 120A. The output signal of the detector is available at lead 120B which conducts the output signal to function block 101, which will be discussed hereinafter in connection with FIGS. 4 and 5.

By operation of circuitry which will be discussed hereinafter in connection with FIG. 4, the potential on each of the individual conductors 116-1 to 116-16 is changed from a first to a second voltage level in accordance with a predetermined time sequence. For the moment, such circuitry may be considered to reside in function block 101 in FIG. 1. Conductors 116 are connected at one end to the circuitry in 101, and are not terminated at the other end. Thus, no substantial steady state current flows through the conductors, and the conductors experience only changes in voltage.

Figure 2:
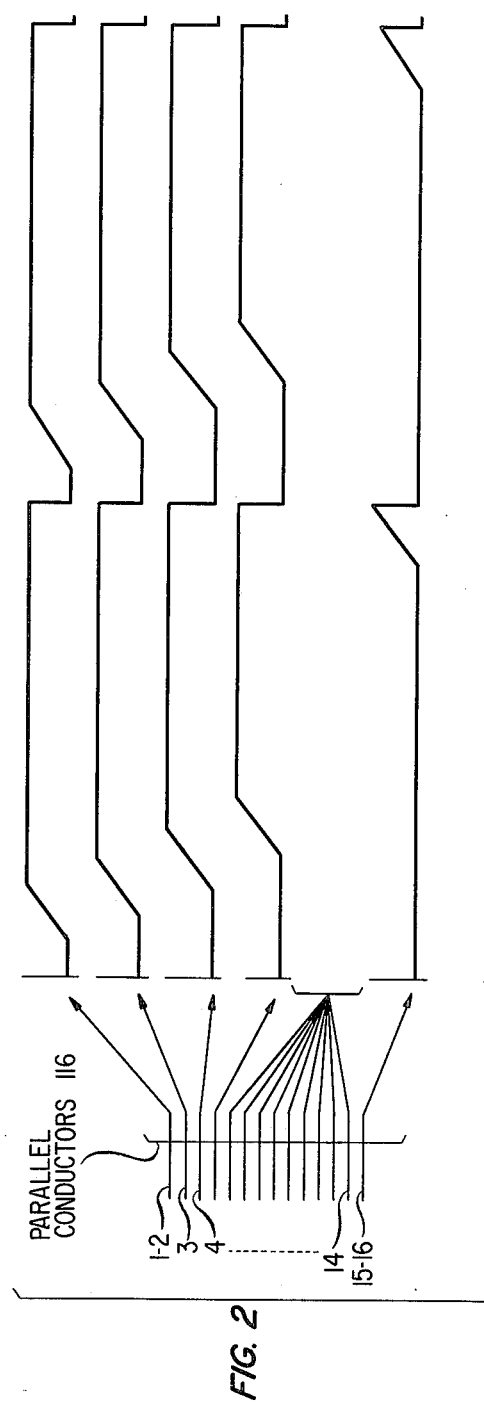
FIG. 2 shows the amplitude-time relationship of the signals applied to each of plural, parallel conductors to generate a propagating change in electric field.

FIG. 2 illustrates the temporal relationships between the voltage waveforms applied to each of the conductors 116-1 to 116-16 shown in FIG. 1. In this embodiment of the invention, the first waveform is applied to conductors 116-1 and 116-2, the second waveform is applied to conductor 116-3, the third to conductor 116-4, and the sequence continues until the fourteenth waveform is applied to conductors 116-15 and 116-16. It is elemental to the electrical art that all conductors are surrounded by an electric field which is directly related to the voltage thereon. Immediately after the times R in the time scale in FIG. 2 all of the conductors are at a first (low) potential for at least one of the sixteen time subintervals between each time R. After the first subinterval, the waveform applied to conductors 116-1 and 116-2 begins a substantially linear voltage rise to and remains at a second potential within two subintervals. The second potential is illustratively approximately 100 volts with reference to ground. A similar rise in potential is experienced by the waveform applied to conductor 116-3 beginning after the second subinterval and subsequent waveforms until the fourteenth waveform reaches the second potential after the sixteenth subinterval at which time all of the conductors are reset (at time R) to the first potential.

It should be noted that succeeding waveforms begin their rise in potential before the immediately preceding waveform reaches the second potential. This overlap in time allows the change in the electric field caused by the change in voltage on each conductor to appear to move smoothly from one conductor to the next. The resulting effect is one of causing a time-varying electric field to propagate smoothly in a path along the surface described by the parallel conductors in a direction transverse to the longitudinal axes of the conductors indicated by dashed arrow 100 in FIG. 1. A complete propagation occurs within the time interval defined by successive times R in the time scale in FIG. 2. This interval is periodic and shall hereinafter be referred to as a sample period. In this embodiment of the invention, the sample period is sufficiently short that several such periods will occur within the time it takes a quick-fingered musician to depress the key.

Figure 3:
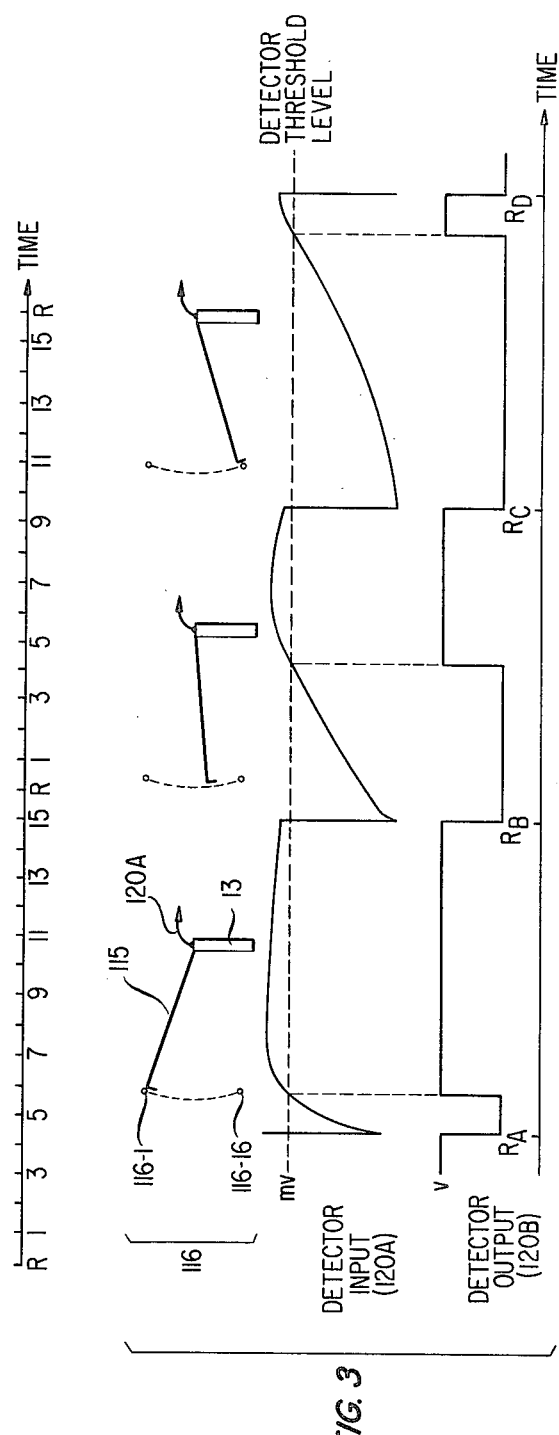
FIG. 3 shows the relationship between the analog position of a single coupling device and the pulse-width modulated output signal of an associated detector.

The time varying change in electric field causes a signal to be transferred to the coupling device by capacitor action. FIG. 3 shows the relationship between the relative position of the coupling device and the corresponding signals at the input and output of its associated detector 120. For purposes of this discussion, attention is drawn only to the input-output characteristics of the detector. A detailed explanation of the operation of illustrative circuitry contained therein will be presented in connection with FIG. 4. FIG. 3 depicts coupling device 115 in three positions relative to conductors 116. In the sample period defined by times RA and RB, coupling device 115 is in a position corresponding to the keyboard key at rest. The signal on the coupling device corresponds to the waveform identified as DETECTOR INPUT (120A). Immediately after time RA the detector output is in a low state and subsequently switches to a high state when the detector input signal reaches a predetermined threshold level. Although the DETECTOR INPUT waveform clearly illustrates that a signal is transferred to the coupling device early in the sample period, mutual interception between the coupling device and the propagating change in the electric field shall hereinafter be deemed to occur when the signal on the coupling device exceeds the "detector threshold level", thereby causing the output of the detector to go high. The high input impedance of the detector permits the charge on the coupling device to drain slowly, and the resulting RC time constant is much longer than the sample period. For this reason, the detector input and, consequently, the detector output remain in a high state until the conductors 116 are reset, as previously explained, at time RB.

During the sample period defined by times RB and RC, the coupling device is shown in a midway position. Correspondingly, the output of the detector is in a low state for a longer period. Finally, when the coupling device is down, as shown during the sample period defined by times RC and RD, the detector output signal is in a low state for almost the entire sample period. The detector output signal, therefore, is a pulse-width-modulated (PWM) representation of the relative position of the coupling device.

Figure 4:
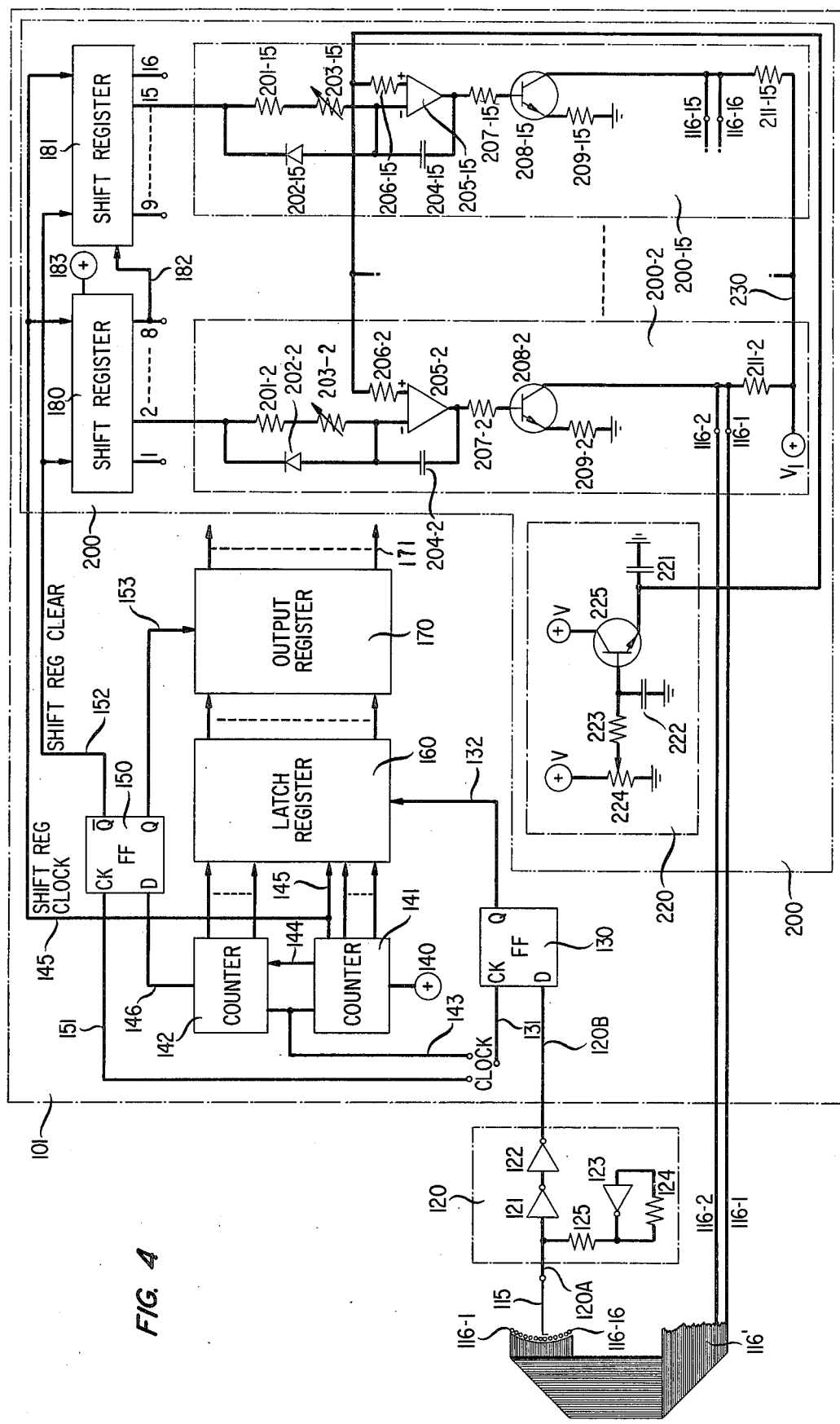
FIG. 4 shows partly in schematic representation and partly in block and line representation, an analog position-to-digital encoder for a single keyboard key.

FIG. 4 shows partially in block and line form and partially in schematic form a position to digital encoder which is suitable for digitally encoding the position of only one movable device. A system for generating digital signals responsive to the positions of many movable devices will be discussed hereinafter in connection with FIG. 5. Identical reference numbers and characters are used to identify corresponding elements in all the drawings. Circuitry shown to the right of dashed line 101 is the circuitry mentioned above in connection with function block 101 in FIG. 1.

Detector 120, shown in FIG. 4, receives at its input 120A the small signal transferred to coupling device 115 by operation of the propagating change in electric field about conductors 116, as described in connection with FIGS. 1 and 3. In this embodiment of the invention, detector 120 is comprised of three relatively inexpensive complementary metal oxide semiconductor (CMOS) logic inverter amplifiers such as RCA type 4049AE. Two such amplifiers, 121 and 122 are cascaded to achieve an overall voltage gain of approximately 100. Since CMOS logic inverters of this type have a narrow critical input biasing range on either side of which the output states are determined, a biasing arrangement comprising CMOS inverter amplifier 123, feedback resistor 124 and resistor 125 is employed to bias the input terminal of CMOS amplifier 121 nominally in the critical range. In practice, amplifiers 121, 122 and 123 will be on the same chip and, therefore, have similar operating characteristics. Feedback resistor 124 provides negative self-feedback to amplifier 123. Since amplifier 123 is an inverter amplifier, a high output signal from the output is fed back to the input causing the output to decrease. Similarly, the decrease in output signal is fed back causing the output to increase. The overall effect of such feedback is to cause the output of amplifier 123 to stabilize at a voltage level between states. This voltage level will generally coincide with the mid-state level of other such inverter amplifiers which share a common potential supply and ground return on the same integrated circuit chip. The output of amplifier 123 is conducted to the input of amplifier 121 via resistor 125.

An alternative scheme for providing bias to the input terminal of amplifier 121 is to replace components 123, 124 and 125 in the detector circuit with a variable voltage divider (i.e., a potentiometer) which is connected across a supply voltage and ground. The wiper arm is connected to the input of amplifier 121 and adjusted to provide the correct amount of input bias. Persons skilled in the art can select the proper supply voltage and potentiometer resistance values so as to make the output of detector 120 at conductor 120B responsive to the signal at input lead 120A as described above in connection with FIG. 3.

The output of detector 120 is conducted via lead 120B to the input of D-type flip-flop 130. Flip-flop 130 delays the state changes present at the output of the detector so that the resulting output signal on lead 132 is synchronized with clock-rate timing signals provided at terminal 131 of the flip-flop. Such timing signals are provided at all terminals in FIG. 4 identified with the word "CLOCK" from a source which is not shown. As will be shown hereinbelow, there are 256 clock-rate timing signals in each sample period (i.e., R-to-R periods in FIGS. 2 and 3) in the embodiment of the invention shown in FIG. 4. For purposes of this discussion, the signal on lead 132 at the output of flip-flop 130 is functionally indistinct from the signal on lead 120B at the output of detector 120. Lead 132 connects the output of flip-flop 130 to latch register 160. The register has bit-parallel inputs along its left side for receiving digital binary signals from the output of counters 141 and 142.

Counters 141 and 142 count the clock-rate timing signals provided at terminal 143 and generate digital signals which are used for digitally encoding the position of the movable device and synchronizing the propagating change in electric field within a sample period. Each of the counters is a four-bit counter which counts up to sixteen counts. Counter 141 is enabled by the high logic state present at terminal 140, and counts every timing signal provided at terminal 143. Counter 142, however, is enabled by the overflow signal from counter 141 on connector lead 144. Therefore, counter 142 will count only those timing pulses which are provided while counter 141 is full. The overflow signal from counter 141 permits counter 142 to perform as an incremented counter so that the two counters count a total of 256 timing signals before counter 142 issues an overflow signal via connector lead 146.

Latch register 160 stores the numbers issued by counters 141 and 142 via the bit-parallel inputs while the output of flip-flop 130 at lead 132 is in a low state. Such a low state indicates that the coupling device and the propagating change in the electric field have not yet intercepted each other. After interception, lead 132 bears a high logic state, and, in response, the latch register will not accept new numbers from the counters, thereby retaining the number which issued just prior to the transition to the high state. This number corresponds to the relative position of the coupling device at the time the coupling device intercepted the change in the electric field. Even though latch register 160 does not accept new data after the output of flip-flop 130 enters a high state, counters 141 and 142 continue to count timing signals until a high overflow signal issues from counter 142 at lead 146 after the 256th count. Propagation delays and noise in counter 142 require the overflow signal to be synchronized with the clock-rate timing signals; therefore, D-type flip-flop 15 with complementary outputs is provided to receive the high overflow signal and transmit a high state signal to output register 170 in synchrony with clock-rate timing signals at terminal 151. The high state signal causes the output register to accept and store the number retained in latch register 160 when the output of flip-flop 130 entered a high state. The number is a PCM representation of the position of the coupling device relative to the propagating change in the electric field, and is available as an output signal at bit parallel outputs 171 of the output register. A new PCM number is outputted for each sample period, every 256th clock-rate timing signal. Practitioners of this invention may connect circuitry (not shown) to the bit-parallel outputs of the output register for displaying or processing such PCM information, as desired.

The output signal of counter 141 at lead 145 is used to control the rate of propagation of the above-mentioned change in electric field within a sample period. This output signal is issued once for every sixteen counts of the clock-rate timing signals provided at terminal 143, thereby providing sixteen periodic pulses to shift registers 180 and 181 during a sample period. Shift registers 180 and 181 are of a commercially available type, and are connected to each other by lead 182 to act as one long register with 16 outputs. At the beginning of each sample period, all outputs 1 through 16 of the shift registers bear illustratively low logic state voltages. The 16 output pulses per sample period which issue from output lead 145 drive shift registers 180 and 181 through one complete shift cycle within each sample period. The high state signal at input terminal 183 to shift register 180 provides the high input state to be shifted by that shift register. Output 8 of shift register 180 provides via lead 182 the state to be shifted by shift register 181. When counter 142 fills at the end of a sample period, the overflow signal conducted to flip-flop 150 via conductor 146 causes an inverted (low) reset signal to issue to the shift registers via conductor 152. Such a low state reset signal is necessitated by the internal structure of the shift registers, and causes all of the shift register outputs to return simultaneously to the low logic level.

In this embodiment of the invention, outputs 2 through 15 of the shift registers are connected to and drive respectively associated ramp generator circuits 200-2 to 200-15 in propagating electric field generator 200. The individual ramp generator circuits are identical to one another, therefore only two such generators, 200-2 and 200-15, are shown in schematic detail. Fourteen such generators are contained in the electric field generator 200, and these provide the waveforms shown in FIG. 2 to the conductors 116. Generators 200-2 and 200-15 each supply waveforms to two parallel conductors, 116-1 and 116-2, and 116-15 and 116-16, respectively. The conductors (116) are connected to correspondingly identified output terminals at the collectors of transistors 208.

Each of the fourteen ramp generators in electric field generator 200 functions as follows: Selecting ramp generator 200-2 as illustrative of the operation of all such ramp generators, output 2 of shift register 180 is connected to the inverting input of current-summing amplifier 205-2 via series connected resistors 201-2, 203-2, and diode 202-2 which is connected in shunt across the resistors and poled for forward conduction toward the shift register. The noninverting input to amplifier 205-2 is held at a preselected current level by bias circuit 220 which is connected thereto via resistor 206-2. Considerations to be weighed in setting the bias current level will be discussed below in connection with the description of circuit 220.

When output 2 of shift register 180 bears a high logic level, a low logic level is generated at the output of amplifier 205-2. The output of amplifier 205-2 is transmitted via resistor 207-2 to the base terminal of NPN transistor 208-2. With such a low level signal at its base input, the current through transistor 208-2 decreases, and the voltage at its collector increases. Feedback capacitor 204-2 associated with amplifier 205-2, and associated resistive circuitry comprising resistors 201-2, 203-2, 206-2, and 207-2 control the time constant which determines the rate at which the output of amplifier 205-2 enters the low logic state after output 2 of the shift register goes high. The values of these circuit components are selected to cause the output of amplifier 205-2 to decrease at a steady, substantially linear rate, which decrease in voltage is inverted at the collector outputs 116-1 and 116-2 of the common emitter arrangement of transistor 208-2. In some embodiments of the invention, feedback capacitor 204-2 may be omitted and replaced by a feedback capacitor connected at one end to the noninverting input to the amplifier, and to the collector of the associated NPN transistor at the other end. This provides the advantage of correcting some of the nonlinearities in the combined amplifier and transistor. Additionally, the combined amplifier and transistor provide greater gain than the amplifier alone, thereby permitting the use of a smaller feedback capacitor.

Outputs 116-1 and 116-2 are respectively connected to conductors 116-1 and 116-2 shown in cross section near coupling device 115 by separate wires of cable 116'. The actual end connections of all the conductors in cable 116' to respective ramp generator output terminals are not shown, to preserve the clarity of the drawing. When output 2 of shift register 180 returns to a low logic state, diode 202-2 becomes forward biased and effectively bypasses series resistors 201-2 and 203-2 so as to create a much shorter RC time constant during reset to a low logic level than when setting to a high logic level. Thus, although outputs 116-1 and 116-2 of ramp generator 200-2 exhibit a relatively slow linear transition from a low logic state to a high logic state, the return to the low logic state is of relatively short duration. The rapid return to a low logic level at the output of each ramp generator causes all of conductors 116 to generate simultaneously a strong electric field change in the negative direction which causes detector 120 to return to a low output state, regardless of the position of coupling device 115.

Bias circuit 220 is connected to the noninverting input of each amplifier 205 via associated resistors 206. This circuit provides at the emitter of transistor 225 a constant output voltage which is filtered by capacitor 221 which shunts to ground any spurious noises. The output voltage is determined by the ratio of the voltage divider formed by potentiometer 224 connected between a voltage source and ground. The wiper arm of potentiometer 224 is connected to the base input of transistor 225 via resistor 223 to control the conduction level through the transistor. Capacitor 222 filters the voltage at the base input of transistor 225 to remove noises caused by the potentiometer wiper mechanism. The electrical characteristics of the input terminals of amplifiers 205 appear as diodes connected to ground. Thus, the voltages at the noninverting and inverting input terminals are respectively one diode voltage drop above and below ground. The constant voltage provided by bias circuit 220 causes a constant current to be delivered to the respective noninverting inputs of current summing amplifiers 205 via respective resistors 206. This current is a bias reference current to which is compared the current flowing through the inverting inputs of amplifiers 205. The current flowing through the inverting input of each current summing amplifier is the algebraic summation of a current flowing through resistors 201 and 203, a current flowing through diode 202 and the current flowing through feedback capacitor 204. The output signal from each amplifier 205 is proportional to the difference in the currents flowing through the respective input terminals.

In practicing this invention, adjustment of the signals present on conductors 116 is necessary to ensure that detector 120 is responsive thereto. As previously stated, a signal is transferred to coupling device 115 by capacitive coupling with conductors 116. Such coupling is adjustable within narrow limits by adjusting the proximity of the coupling device to the conductors, however, such distance correction is generally limited by manufacturing tolerances. Similarly, the effective capacitor plate area (i.e., end face area) of coupling device 115 is adjustable over only a narrow range because it is fixed at the time the coupling device is constructed. Although an increase in the effective end face area of the coupling device would increase the amount of capacitive coupling between it and the parallel conductors, such an area increase cannot be achieved by a significant increase in the horizontal dimension of the coupling device because of the proximity of neighboring coupling devices in arrangements such as that discussed below in connection with FIG. 5. Similarly, it is not advantageous to increase the vertical dimension of the end face because such an increase diminishes the effective encoding range and resolution of the system. It has been determined, therefore, that adjustments of the signals on the parallel conductors are most effective in producing responsive and reliable output signals from the detectors.

A first parameter in the signal waveforms applied to the parallel conductors 116 which is advantageously preselected to ensure a reliably responsive signal at the output of the detector is the difference between the first and second potentials shown for such waveforms in FIG. 2. The maximum change in voltage levels is a function of the supply voltage on conductor 230 in electric field generator 200 in FIG. 4. In one practicable embodiment of the invention the supply voltage is approximately 100 volts. A second preselectable parameter is the slope of the ramps shown in FIG. 2. The slope of each ramp signal is adjustable by operating respectively associated variable resistor 203 at the inverting input of each amplifier 205 in FIG. 4. Additionally, the slopes of all such ramp signals are adjusted in common by operating the wiper arm of potentiometer 224 in circuit 220. The ramp slopes are adjusted to effect a compromise between slopes which are too gentle and, therefore, do not provide sufficient dV/dt to transfer an adequate signal to the coupling device, and slopes which are too steep and, therefore, provide little or no overlap between the ramp signals on adjacent conductors. Such insufficiency of overlap between adjacent ramp signals decreases encoding resolution by preventing a smooth propagation of the change in electric field across the surface of the parallel conductors. In the above-mentioned practicable embodiment of the invention, the ramp signal slopes were adjusted to be in substantial accord with that portion of the above descriptive discussion which relates to FIG. 2.

Figure 5:
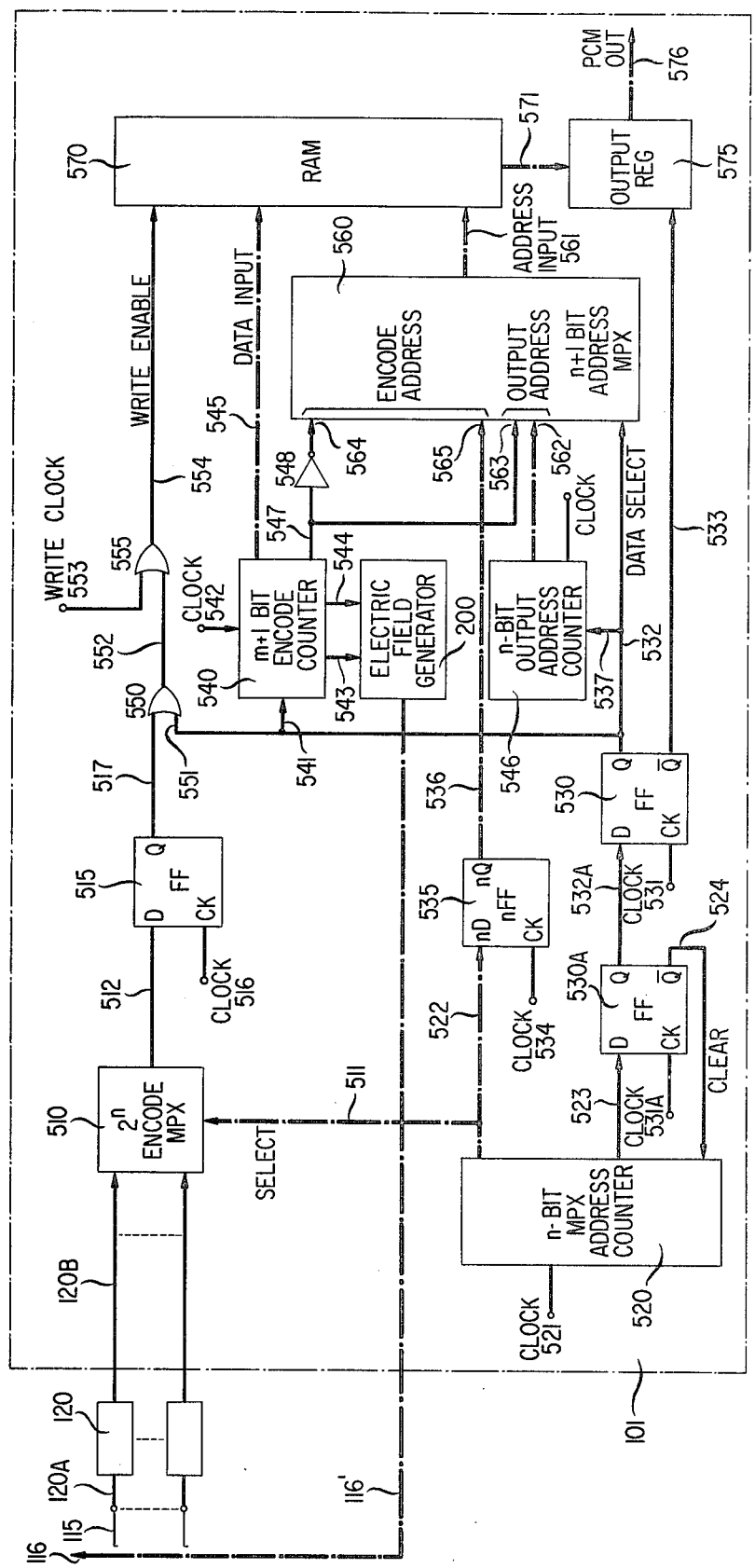
FIG. 5 shows in block line representation an analog position-to-digital encoder for many movable devices.

FIG. 5 shows in block and line form a system for encoding the relative positions of $2^n$ movable devices with m bits resolution. The essential function of the encoding system in FIG. 5 is to receive PWM data from plural detectors (120), convert such PWM data into PCM data, and provide at its output (576) a PCM data stream containing information corresponding to the position of each coupling device (115). Briefly, each detector is assigned a periodic time slot by a multiplex address counter (520) in combination with an encode multiplexer (510), during which the output signal of a respective detector is selected for delivery to a random access memory (RAM) (570). An encode counter (540) counts the number of times within a sample period that each detector has been selected, which number is advantageously entered and stored in one-half of the RAM in a first set of address locations associated with respective detectors, in response to the output state of the particular one of the detectors selected. The number is entered in the RAM if the output of the detector is in a low state (i.e., before the coupling device and the propagating change in electric field intercept each other). At the end of a sample period when the state of the output of each detector has been selected $2^n$ times, the RAM contains in respective addresses the PCM encoded value of the position of each coupling device.

The system contains circuitry for providing to an output register (575) the PCM information stored in a second set of address locations during the previous sample period while new PCM data is entered in the first set of address locations. Thus, new PCM data is entered during a sample period into one-half of the RAM while the PCM data from the immediately prior sample period is being outputted from the other half. The respective halves of the RAM interchange between the input and output functions on alternate sample periods. That half of the RAM which receives new PCM data during a sample period will output such data during the subsequent sample period. The output signal (576) is in the form of a $2^n$ way time multiplexed pulse code modulated (PCM) signal. Circuitry to the right of the dashed line 101 corresponds to illustrative function block 101 in FIG. 1.

$2^n$ detectors 120 are connected at their outputs 120B to encode multiplexer 510. Encode multiplexer 510 selects during predetermined clock-rate time slots respective detectors in a sequence determined by the digital number output of multiplex address counter 520. The output of multiplex address counter 520 is conducted to encode multiplexer 510 by conductors 511 which include n individual conductors. Due to propagation delays within the encode multiplexer, the output signal at conductor 512 is not responsive to the selected input until a fraction of a time slot after the detector is selected. This problem is solved by resynchronizing the output of encode multiplexer 510 with the clock-rate timing signals. Such resynchronization is accomplished by delivering the output of the encode multiplexer to the data input of D-type flip-flop 515. The flip-flop is set by the positive going transition of the clock-rate timing signal at terminal 516. Thus, the output of the flip-flop at conductor 517 is informationally identical to the output of the encode multiplexer, but delayed by one clock-rate time slot. It should be noted that, unlike the embodiment of FIG. 4 where each sample period contains $2^n$ (i.e., 256 where n=8) timing signals per sample period, the embodiment of FIG. 5, as will be discussed hereinbelow, contains $2^m(2^n+1)$ clock-rate timing signals per sample period.

Multiplex address counter 520 contains $2^n$ states for counting clock-rate timing signals present at its input 521, and outputs in bit-parallel fashion digital signals which correspond to the number of counts via two sets of n conductors 522 and 511. The n bit-parallel output bits on conductors 522 are conducted to the input of an n bit address delay 535 which, in this embodiment, contains n flip-flops, shown as a single flip-flop for drawing convenience, for synchronizing the bit-parallel input (522) with the delayed encode multiplexer data at conductor 517. The synchronized number is outputted via n bit-parallel conductors 536. When multiplex address counter 520 enters the $2^n$ state (after the $2^n-1$ count) a high overflow signal issues via conductor 523 to a D-type flip-flop 530A. Flip-flop 530A provides a first time slot delay to the overflow signal by synchronizing overflow signal with clock-rate timing signals at terminal 531A and provides a high enabling signal via conductor 532A to a flip-flop 530 which provides a second clock-rate time slot delay. Simultaneously with the high enabling signal, a complementary low signal is conducted from flip-flop 530A via conductor 524 to clear multiplex address counter 520. Thus, multiplex address counter 520 is set to zero once on the $2^n$ count as a result of normal roll over, and again on the $2^n+1$ count by the clear operation of flip-flop 530A. A total of $2^n+1$ signals are counted for each time the encode multiplexer completes a cycle whereby all of the outputs of the detectors have been sampled once. This double zero arrangement provides an extra time slot in each such cycle which is used, as will be described hereinbelow, to output PCM data which was generated during the immediately previous sample period.

Encode counter 540 counts up to $2^{(m+1)}$ clock-rate timing signals delivered thereto at terminal 542, only during such time as it is enabled by a high state signal at input terminal 541 from flip-flop 530. Thus, encode counter 540 counts one clock-rate timing signal for each time that multiplex address counter 520 overflows (i.e., once each $2^n+1$ clock-rate timing signals). All detectors 120 are each sampled once by multiplexer 510 during each increment of the encode counter 540. Although the encode counter counts $2^m$ clock-rate timing signals in each sample period, it is provided with twice that many states ($2^{(m+1)}$) so as to provide a most significant bit at a conductor 547 which changes between high and low states on alternate sample periods. The signal on conductor 547 is used to select memory locations in alternating halves of RAM 570, as will be discussed hereinbelow. The output of the encode counter is conducted in bit-parallel to RAM 570 via conductors 545. Additionally, the most significant bit from the output of encode counter 540 is conducted to different inputs of an address multiplexer 560 by way of conductor 547, and a logic inverter 548. In some embodiments of the invention, conductors 543 and 544 are advantageously connected to encode counter 540 to derive therefrom shift register clock and clear signals to electric field generator 200 for use as explained in connection with FIG. 4. In light of the teaching of the above descriptive discussion in connection with FIG. 4, persons skilled in the art can connect conductors 543 and 544 to encode counter 540 in FIG. 5 in a manner analogous to respective conductors 145 and 152 in FIG. 4. Alternatively, it would be obvious to persons skilled in the art to derive the shift register clock and clear signals from output address counter 546.

Output address counter 546 is an n-bit counter which is enabled, as is the encode counter, by the output of flip-flop 530 via conductors 532 and 537 once every $2^n+1$ clock-rate timing signals. The bit-parallel output of the output address counter is conducted to input 562 of address multiplexer 560. Address multiplexer 560 delivers to RAM 570 the address number corresponding to the output of output address counter 546 and the most significant bit from encode counter 540 at input 563 during such times as the output of flip-flop 530 at conductor 532 is in a high state. Thus, the output address counter determines which address location in RAM 570 will be delivered to output register 575. In some embodiments of the invention, as, for example, where n=m, output addresses may be obtained from encode counter 540, thereby obviating the need for output address counter 546. Alternatively, such output addresses may be provided on demand by a computer which processes the PCM output of the encoder.

RAM 570 contains sufficient storage spaces for $2^{(n+1)}$ words of m bits each. The RAM may be viewed as containing top and bottom halves of $2^n$ word storage spaces each. Respective halves of the RAM are addressed during alternate sample periods in accordance with the logic state of the most significant bit of encode counter 540 as seen by address multiplexer 560 at inputs 563 and 564. When the output of flip-flop 530 at conductor 532 is in a low state, address multiplexer 560 will deliver to RAM 570 via conductors 561 the address signal corresponding to the encode address number at inputs 564 and 565. When the output of the flip-flop is in a high state, the address multiplexer will deliver to the RAM the address signal corresponding to the number present at inputs 562 and 563.

For purposes of the following description of the operation of the circuit of FIG. 5, it will be assumed that the circuit has been in operation from a prior time, and, therefore, RAM 570 contains in its bottom half the PCM encode words generated during the immediately prior sample period. The $2^n-1$ count, by multiplex address counter 520 causes all of the signals on conductors 522 and 511, and the overflow signal at conductor 523 to go high. The next count, $2^n$, causes all of the conductors 522 and 511 to go to zero. On the following count, $2^n+1$, flip-flop 530A is still set, causing the multiplex address counter to clear and thereby remain at count zero as explained above.

Between counts $2^n+1$ and $2^n+2$, the output of flip-flop 530 at conductor 532 is high thereby causing address multiplexer to deliver to RAM 570 via conductors 561 the address number corresponding to the number in output address counter 546 and the most significant bit from encode counter 540 at inputs 562 and 563 respectively. On the $2^n+2$ count, output register 575 is clocked by the complementary output of flip-flop 530 at conductor 533 so that it accepts via conductors 571 the information from the RAM location addressed by the signals at inputs 562 and 563 of address multiplexer 560.

Encode counter 540 is incremented on the $2^n+2$ count. Between counts $2^n+2$ and $2^n+3$, the output of flip-flop 515 at conductor 517 corresponds to the state of the first (i.e., 0th) detector 120 which was selected during the previous count. Since, as stated above, multiplex address counter 520 remains at zero for two counts, the state of conductor 517 will corresponds to the output of the $0^{th}$ detector for the period of time between counts $2^n+1$ and $2^n+3$. Whether or not the encode number on conductors 545 from encode counter 540 will be written into the RAM depends on the state of the output of the sampled detector. If the detector output is low, signifying that the associated coupling device and the propagating electric field have not yet intercepted each other, the low signal will be conducted through OR gates 550 and 555 and conductor 554 to the WRITE ENABLE input to the RAM, thereby enabling the RAM to write in the addressed memory space the PCM output word from encode counter 540 present on conductors 545. If the detector is high, the PCM output word will not be written into the RAM, and the addressed memory location will retain the number that was in there. In this embodiment of the invention, the propagating change in electric field is delayed from beginning its propagation until some time after the beginning of the sample period, in accordance with FIG. 2, thereby ensuring that all of the detectors are initially in a low state. The most significant bit of the encode counter is low, therefore, the signal at terminal 564 is high by operation of inverter 548. Thus, the addressed storage space is in the top half of the RAM.

The above-described procedure for multiplexing detectors 120, incrementing encode counter 540 and outputting the encoded PCM values from the previous sample period continues until the encode counter has been incremented $2^m$ times. This completes a sample period containing $2^m(2^n+1)$ clock-rate timing signals during which the PCM values in the bottom half of the RAM from the previous sample period have been outputted and new PCM values have been entered into the top half of the RAM. At this time, on the $2^m+1$ increment to the encode counter, the most significant digit of the encode counter changes state thereby reversing the roles of the top and bottom halves of the RAM. Thus, during the next sample period, new PCM values will be entered into the bottom half of the RAM and the values in the top half will be outputted. A major advantage of this encoding and outputting scheme is that PCM values are outputted in evenly timed slots throughout the sample period. This results in the optimization of the bandwidth requirements of the output hardware.

It should be noted that circuitry is provided to protect the contents of the RAM from being written over while prior PCM values are being outputted. Since outputting of prior data occurs in response to the overflow of multiplex address counter 520, the high state output of flip-flop 530 is conducted via conductor 532 to input 551 of OR gate 550. The output of OR gate 550 at lead 552 forms an input to OR gate 555 which operates to ensure that any enabling signals to the RAM occur in synchrony with a timing signal at WRITE CLOCK input 553. This timing signal is of the same clock frequency as the timing signals on all other terminals in FIG. 5 identified as "CLOCK," but is delayed a fraction of a time slot by means not shown to ensure that the RAM does not accept data until such a time within a time slot that the signals on conductors 545 have stabilized. Nevertheless, since the RAM is of such internal structure that it is enabled by a low signal on conductor 554, the high signal from flip-flop 530 at lead 532 effectively disables the write function. This prevents new data from entering the RAM during the output process.

Although the inventive concept disclosed herein has been described in terms of specific embodiments and applications, other applications and embodiments will be obvious to persons skilled in the pertinent art without departing from the scope of the invention. The drawings and descriptions of specific embodiments of the invention in this disclosure are illustrative of applications of the invention and should not be construed to limit the scope thereof.

What is claimed is:

1. An arrangement for generating signals responsive to the position location of a movable device, comprising
    means for generating a time varying electric field wave which propagates in one direction along a first path at a controlled rate during a predetermined interval of time,
    a coupling device which is mechanically coupled to a respectively associated movable device, the coupling device being capable of both moving along a second path which is parallel and adjacent to the first path as the movable device moves and receiving an electric signal from the electric field wave, and
    means capable of generating a signal at the time during the predetermined interval of time when the electric wave intercepts the coupling device for indicating the position of the movable device.

2. The arrangement in claim 1 wherein the means for generating the time-varying electric field wave comprises
    plural conductors arranged in parallel to each other so as to form a surface, which surface contains the first path, and
    means for changing the potential on each conductor from a first to a second voltage level in accordance with a predetermined time sequence so as to cause the change in the electric field which is generated about each conductor when the potential thereon is changed from the first to the second voltage level to propagate smoothly along the first path contained in the surface described by the conductors in said one direction transverse to the longitudinal axes of the conductors.

3. The arrangement of claim 2 wherein the means for changing the potential on each conductor comprises
    a counter comprises a predetermined number of logic states for counting timing signals,
    shift register means connected to the counter and comprising multiple output terminals which initially bear a first logic state and are sequentially energized to a second logic state in response to a predetermined one of the logic states of the counter, and plural waveform generators, each responsive to an associated one of the shift register outputs and connected to at least an associated one of the conductors, for causing the potential on the conductors to change from the first to the second voltage in accordance with a transition waveform of predetermined amplitude and duration.

4. The arrangement in claim 3 wherein the waveform generators each comprise an amplifier having first and second input terminals and an output terminal, means for providing a substantially constant signal to the first input terminal of the amplifier, means for connecting the associated output terminal of the shift register means to the second input terminal of the amplifier, a transistor comprising collector, base and emitter terminals, means for connecting the base terminal of the transistor to the output terminal of the amplifier so as to drive the transistor, and means for connecting at least an associated one of the plural parallel conductors to the collector of the transistor.

5. The arrangement of claim 1 wherein the means capable of generating a signal comprises detector means comprising an input terminal connected to the coupling device and an output terminal, said detector means being capable of providing a first logic state voltage level during the time period of said predetermined interval of time before the coupling device and the propagating electric field wave intercept one another, and a second logic state voltage level during said predetermined interval of time after such interception has occurred.

6. The arrangement in claim 5 wherein the detector means each comprise first and second complementary metal oxide semiconductor (CMOS) logic inverter amplifiers connected respectively in cascade, a third CMOS amplifier having its output fed back to its input and connected to the input of the first amplifier so as to bias the input to a voltage level substantially midway between levels which determine the first amplifier's output logic state.

7. The arrangement in claim 5 further comprising encoding means for generating digital signals responsive to the logic state levels at the output terminal of the detector means, which digital signals are a pulse-code modulated (PCM) representation of the position of the coupling device at the time of interception with the propagating electric field.

8. The arrangement in claim 7 wherein the encoding means comprises a counter for counting timing signals, and storage means capable of receiving and storing the last number in the counter before the detector means changes from the first to the second logic state.

9. The arrangement of claim 1 in which there are provided means for sampling said generating means position indicating signal in a plurality of successive time slots in said predetermined interval of time.

10. The arrangement of claim 1 in which there are provided a plurality of said movable devices and corresponding field generating means, coupling devices, and position signal generating means, and means for sampling said signal generating means position indicating signals of each of said movable devices in a different plurality of time slots of said interval whereby successive samples of position indicating signals of a particular device are taken in nonsuccessive time slots, said pluralities of nonsuccessive time slots being interleaved with one another in each interval.

11. An arrangement for generating signals responsive to the position locations of many independently movable devices, comprising means for generating a time-varying electric field wave which propagates in one direction along a first path at a controlled rate during a predetermined interval of time, plural coupling devices mechanically coupled to separate respectively associated movable devices, which coupling devices are capable of movement along respective paths which are parallel and adjacent to the first path as the respective movable devices are moved, each coupling device being capable of receiving an electric signal from the elecric field wave, and means capable of generating signals responsive to the position of each coupling device during the predetermined interval of time relative to the time-varying electric field.

12. The arrangement in claim 11 wherein the means for generating the time-varying electric field wave comprises plural conductors arranged in parallel to each other so as to form a surface, which surface contains the first path, and means for changing the potential on each conductor from a first to a second voltage level in accordance with a predetermined time sequence so as to cause the change in the electric field which is generated about each conductor when the potential thereon is changed from the first to the second voltage level to propagate smoothly along the first path contained in the surface described by the conductors in said one direction transverse to the longitudinal axes of the conductors.

13. The arrangement in claim 12 wherein the means for changing the potential on each conductor comprises a counter comprising a predetermined number of logic states for counting timing signals, shift register means connected to the counter and comprising multiple output terminals which initially bear a first logic state and are sequentially energized to a second logic state in response to a predetermined one of the logic states of the counter, and plural waveform generators, each responsive to an associated one of the shift register outputs and connected to at least one of the conductors, for causing the potential on the conductors to change from the first to the second voltage in accordance with a transition waveform of predetermined amplitude and duration.

14. The arrangement in claim 13 wherein the waveform generators each comprise an amplifier having first and second input terminals and an output terminal, means for providing a substantially constant signal to the first input terminal of the amplifier, means for connecting the associated output terminal of the shift register means to the second input terminal of the amplifier, a transistor comprising collector, base and emitter terminals, means for connecting the base terminal of the transistor to the output terminal of the amplifier so as to drive the transistor, and means for connecting at least an associated one of the plural parallel conductors to the collector of the transistor.

15. The arrangement in claim 11 wherein the means for generating digital signals, comprises a first counter having a predetermined number of states for counting timing signals and outputting first digital signals responsive to the number of timing signals counted and a second signal for indicating that the final state of the counter has been reached, plural detector means each having an input terminal connected to an associated coupling device and an output terminal for providing a first logic state voltage level before the coupling device and the propagating electric field wave intercept one another, and a second logic state voltage level after such interception, first multiplexing means having plural inputs connected to the output of each of the plural detector means and to the first output of the first counter and an output for providing a logic state responsive to the logic state at the output of the particular one of the detector means which has been selected for sampling in response to the digital signals at the first output of the first counter, a second counter having a first predetermined number of states for counting timing signals during such times as it is enabled by the second output signal of the first counter and outputting digital signals responsive to the number of timing signals counted, and memory means with first, second and third inputs, and having first capacity for storing the output signals of the second counter received at the first input in memory addresses corresponding to the first output of the first counter received at the second input, in response to the logic state at the output of the first multiplexing means, which logic state is received at the third input.

16. The arrangement of claim 15 wherein the second counter has a second predetermined number of states, which second number is twice the first predetermined number, the memory means are of second capacity for storage, which second capacity is twice the first capacity, the arrangement further comprising second multiplexing means having a first input for receiving the output of the second counter, a second input for receiving the first output of the first counter and the inverted most significant bit of the second counter, a third input for receiving the second output of the first counter and an output connected to the second input of the memory means for delivering thereto the signals at the first or second inputs of the second multiplexing means in response to the logic state of the signal at the third input, an output register having a first input for receiving a signal responsive to the second output of the first counter, a second input connected to the output of the memory means for receiving signals therefrom in response to the signal at the first input, and an output for outputting the signals received from the memory means, and means for preventing data from entering the memory means while the output register is being loaded.

17. The arrangement in claim 16 wherein there is further provided means for generating output memory addresses, and the second multiplexing means receives at the first input the output of the means for generating output memory addresses and the most significant bit of the second counter.

* * * * *